United States Patent
Wakiyama et al.

(10) Patent No.: US 9,548,290 B2
(45) Date of Patent: Jan. 17, 2017

(54) SEMICONDUCTOR DEVICE HAVING MAGNETIC ALIGNMENT MARKS AND UNDERFILL RESIN LAYERS

(75) Inventors: Satoru Wakiyama, Kanagawa (JP); Masaki Minami, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/487,163

(22) Filed: Jun. 2, 2012

(65) Prior Publication Data

US 2012/0313236 A1    Dec. 13, 2012

(30) Foreign Application Priority Data

Jun. 9, 2011  (JP) ................. 2011-129192

(51) Int. Cl.
*H01L 23/544* (2006.01)
*H01L 25/00* (2006.01)
(Continued)

(52) U.S. Cl.
CPC ............. *H01L 25/50* (2013.01); *H01L 23/544* (2013.01); *H01L 24/81* (2013.01); *H01L 25/0657* (2013.01); *H01L 27/1464* (2013.01); *H01L 24/13* (2013.01); *H01L 24/16* (2013.01); *H01L 2223/5442* (2013.01); *H01L 2223/54426* (2013.01); *H01L 2223/54473* (2013.01); *H01L 2224/03912* (2013.01); *H01L 2224/0401* (2013.01); *H01L 2224/05571* (2013.01); *H01L 2224/05572* (2013.01); *H01L 2224/05573* (2013.01); *H01L 2224/05647* (2013.01); *H01L 2224/05666* (2013.01); *H01L 2224/08147* (2013.01); *H01L 2224/10135* (2013.01); *H01L 2224/10165* (2013.01); *H01L 2224/1147* (2013.01); *H01L 2224/11462* (2013.01); *H01L 2224/11849* (2013.01); *H01L 2224/13022* (2013.01); *H01L 2224/13082* (2013.01); *H01L 2224/13111* (2013.01); *H01L 2224/13147* (2013.01); *H01L 2224/13155* (2013.01); *H01L 2224/13166* (2013.01); *H01L 2224/13184* (2013.01); *H01L 2224/14131* (2013.01); *H01L 2224/27416* (2013.01); *H01L 2224/27436* (2013.01); *H01L 2224/73104* (2013.01); *H01L 2224/73204* (2013.01); *H01L 2224/80357* (2013.01); *H01L 2224/80895* (2013.01); *H01L 2224/80896* (2013.01);

(Continued)

(58) Field of Classification Search
CPC ......... H01L 23/544; H01L 24/13; H01L 24/24
See application file for complete search history.

(56) References Cited

U.S. PATENT DOCUMENTS 6,333,206 B1 * 12/2001 Ito et al. ................ 438/106
6,917,106 B2 * 7/2005 Datta ................ H01L 24/03
257/737

(Continued)

FOREIGN PATENT DOCUMENTS

| JP | 10-112477 | 4/1998 |
| JP | 2005-268623 | 9/2005 |
| JP | 2006-041534 | 2/2006 |

*Primary Examiner* — Thanh V Pham
(74) *Attorney, Agent, or Firm* — Sheridan Ross P.C.

(57) ABSTRACT

A semiconductor device includes a semiconductor element, a connection electrode formed on the semiconductor element, and alignment marks formed on the semiconductor element. At least one of the alignment marks is made of a magnetic material.

14 Claims, 10 Drawing Sheets

(51) Int. Cl.
*H01L 23/00* (2006.01)
*H01L 25/065* (2006.01)
*H01L 27/146* (2006.01)

(52) U.S. Cl.
CPC ............... *H01L 2224/81011* (2013.01); *H01L 2224/8113* (2013.01); *H01L 2224/8121* (2013.01); *H01L 2224/81132* (2013.01); *H01L 2224/81141* (2013.01); *H01L 2224/81193* (2013.01); *H01L 2224/81815* (2013.01); *H01L 2224/83193* (2013.01); *H01L 2224/83862* (2013.01); *H01L 2224/9221* (2013.01); *H01L 2225/06513* (2013.01); *H01L 2225/06565* (2013.01); *H01L 2225/06593* (2013.01); *H01L 2924/00014* (2013.01); *H01L 2924/01029* (2013.01); *H01L 2924/12042* (2013.01); *H01L 2924/12043* (2013.01); *H01L 2924/13091* (2013.01)

(56) References Cited

U.S. PATENT DOCUMENTS

2005/0199995 A1\* 9/2005 Nomoto et al. ............. 257/692
2010/0321555 A1\* 12/2010 Takeshita et al. ............ 348/340

\* cited by examiner

SEMICONDUCTOR DEVICE HAVING MAGNETIC ALIGNMENT MARKS AND UNDERFILL RESIN LAYERS

BACKGROUND

The present technology relates to a semiconductor device including alignment marks that allow positioning during connection, and to a manufacturing method for the semiconductor device.

In the related art, alignment marks formed in a wiring layer on a semiconductor device are used to connect a semiconductor device, such as in flip-chip mounting in which solder bump are used and connection between semiconductor substrates. The alignment marks are used for optical positioning, in which a camera or the like is used, to connect the semiconductor device.

There is disclosed a technology in which bump electrodes with no electrical connection made of a magnetic material are formed on a semiconductor element and a circuit substrate on which the semiconductor element is to be mounted to achieve self-alignment using the attracting magnetic force of the magnetic material (see Japanese Unexamined Patent Application Publication Nos. 2005-268623 and 2006-41534, for example). There is also disclosed a technology in which a magnetic material is provided in bumps used for electrical connection between a semiconductor element and a wiring substrate to achieve self-alignment using the magnetic force of the magnetic material when the semiconductor element is mounted onto a circuit substrate (see Japanese Unexamined Patent Application Publication No. 10-112477, for example).

SUMMARY

For connection of a semiconductor device, it is desired to improve the reliability of connection between electrodes. In particular, it is desired to improve the positioning accuracy during connection as the interval between the semiconductor element and the circuit substrate and the pitch between the electrodes become smaller along with miniaturization of semiconductor elements.

When positioning is performed using an optical camera, a device including the optical camera recognizes alignment marks formed on a semiconductor element to perform positioning. Therefore, the positioning accuracy significantly depends on the accuracy of the optical camera.

The semiconductor element mounting technologies according to Japanese Unexamined Patent Application Publication Nos. 2005-268623 and 2006-41534 do not describe a specific method to connect between a semiconductor element and a circuit substrate using bump electrodes or the like, or a method to magnetize the bump electrodes. Therefore, the technologies do not improve the accuracy in positioning between the semiconductor element and the circuit substrate in order to improve the reliability of connection between the electrodes.

In the technology according to Japanese Unexamined Patent Application Publication No. 10-112477, a magnetic material is used in bump electrodes or dummy bumps. Then, after the semiconductor element is disposed, the magnetic material is magnetized to perform accurate positioning. In the technology, the bump electrodes are not accurately positioned with respect to each other when the semiconductor element is first disposed. Therefore, if significant positional deviation is caused when the semiconductor element is first disposed, self-alignment may not be performed using a magnetic force to enhance the accuracy in positioning between the bump electrodes.

With the technologies according to Japanese Unexamined Patent Application Publication Nos. 2005-268623, 2006-41534, and 10-112477, as discussed above, it is difficult to enhance the positioning accuracy during connection of electrodes of semiconductor elements, and to improve the connection reliability.

It is desirable to provide a semiconductor device that improves the positioning accuracy to improve the connection reliability, and a manufacturing method for the semiconductor device.

According to an embodiment of the present technology, there is provided a semiconductor device including: a semiconductor element; a connection electrode formed on the semiconductor element; and alignment marks formed on the semiconductor element, in which at least one of the alignment marks is made of a magnetic material.

According to another embodiment of the present technology, there is provided a semiconductor device including: a semiconductor substrate; a wiring layer formed on the semiconductor substrate; a connection electrode formed on a surface of the wiring layer; and alignment marks formed in the same layer as the connection electrode, in which at least one of the alignment marks is made of a magnetic material.

According to still another embodiment of the present technology, there is provided a manufacturing method for a semiconductor device, including: preparing a substrate on which a semiconductor element is formed; forming alignment marks on the substrate; and forming a connection electrode on the substrate, in which at least one of the alignment marks formed on the semiconductor element is made of a magnetic material.

According to the semiconductor device and the manufacturing method for the semiconductor device discussed above, at least one of the alignment marks of the semiconductor element is made of a magnetic material. By providing magnetism to the alignment marks made of a magnetic material, the alignment marks are accurately positioned with respect to each other through the magnetic force of the magnetic material, without optical positioning, during connection of the connection electrode of the semiconductor element. This improves the positioning accuracy with which the semiconductor device is disposed, and improves the reliability of connection of the electrode of the semiconductor device.

DETAILED DESCRIPTION OF EMBODIMENTS

Embodiments of the present technology will be described below. However, the present technology is not limited to such embodiments.

The description will be made in the following order.
1. Semiconductor device according to first embodiment
2. Manufacturing method for semiconductor device according to first embodiment
3. Semiconductor device according to second embodiment
4. Manufacturing method for semiconductor device according to second embodiment
5. Electronic device according to embodiment <1. Semiconductor Device According to First Embodiment>

A semiconductor device according to a first embodiment will be described below.

Figure 1:
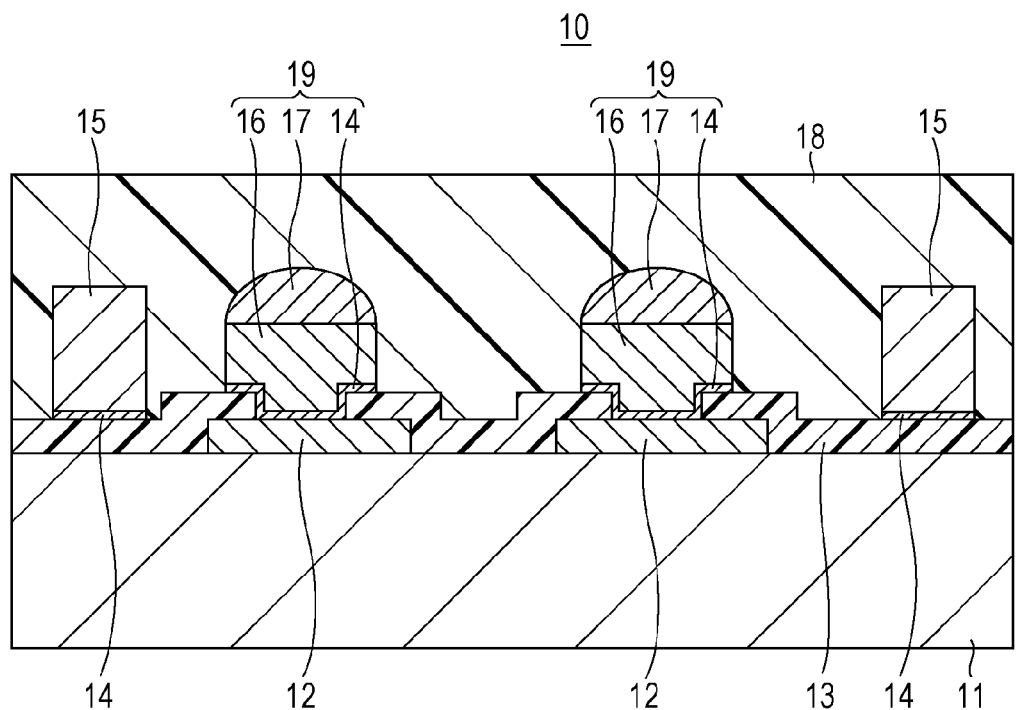
FIG. 1 is a cross-sectional view showing the configuration of a semiconductor device according to a first embodiment.
Figure 2:
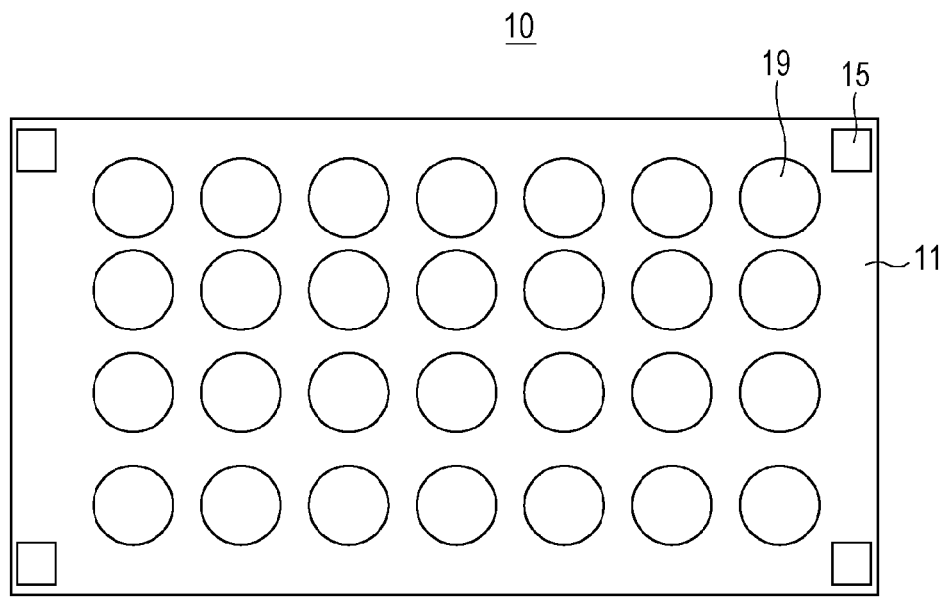
FIG. 2 is a plan view showing the configuration of a surface of the semiconductor device according to the first embodiment on which bump electrodes are formed.

FIG. 1 is a cross-sectional view showing the configuration of the semiconductor device according to the first embodiment. A semiconductor device 10 shown in cross section in FIG. 1 includes bump electrodes 19 on pad electrodes 12 formed on a semiconductor element 11, and alignment marks 15. FIG. 2 is a plan view showing the configuration of a surface of the semiconductor device according to the first embodiment on which the bump electrodes 19 are formed.

As shown in FIG. 1, the semiconductor device 10 includes the pad electrodes 12 on the semiconductor element 11. A passivation layer 13 is formed all over the semiconductor element 11 except for openings on the pad electrodes 12.

The bump electrodes 19 are formed on the pad electrodes 12 to serve as electrodes for connection with an external device. The bump electrode 19 includes a barrier layer 14 formed on the pad electrode 12, an under bump metal (UBM) 16 formed on the barrier layer 14, and a bump 17 formed on the UBM 16. As shown in FIG. 2, the bump electrodes 19 are formed in an array on a main surface of the semiconductor element 11.

The pad electrodes 12 are made of aluminum, for example, and connected to an electronic circuit on a substrate (not shown) via the semiconductor element 11. The passivation layer 13 is formed on the surrounding portion of a surface of the pad electrode 12. The barrier layer 14 and the UBM 16 are formed on the center portion of the surface of the pad electrode 12.

The semiconductor device 10 also includes the alignment marks 15 formed on the passivation layer 13. An underfill resin 18 is formed all over the semiconductor element 11 to cover the bump electrodes 19, the alignment marks 15, and the passivation layer 13.

In the semiconductor device 10, as shown in FIG. 2, the bump electrodes 19 are formed on the center side of the semiconductor element 11. The alignment marks 15 are formed on the outer peripheral side with respect to the bump electrodes 19. The alignment marks 15 are respectively provided at the four corners of the semiconductor element 11.

The barrier layers 14 are formed to coat the center portion of the pad electrodes 12. The barrier layers 14 are formed on a portion of the passivation layer 13 formed on the surrounding portion of the surface of the pad electrodes 12 and under the UBMs 16.

Additional barrier layers 14 are formed between the respective bottoms of the alignment marks 15 and the passivation layer 13, as with those formed on the pad electrodes 12.

The barrier layers 14 are formed from Ti or Cu, for example.

The UBMs 16 are formed on the center portion of the pad electrodes 12 via the barrier layers 14 discussed above. The bumps 17 are formed on the UBMs 16. In this way, the bump electrodes 19 formed from the barrier layers 14, the UBMs 16, and the bumps 17 are formed on the pad electrodes 12.

The UBMs 16 are formed to have a certain thickness or more in order to resist corrosion due to solder forming the bumps 17. The UBMs 16 are formed from Ni, Ti, TiW, W, or Cu, for example. Normally, the UBMs 16 are formed to be thicker than the barrier layers 14 and the pad electrodes 12 in order to prevent a solder alloy such as SnAg formed on the UBMs 16 from spreading onto the pad electrodes 12 made of AlCu, Cu, or the like.

The bumps 17 are formed on the UBMs 16 in the shape of a hemisphere projecting upward from the pad electrodes 12. The bumps 17 are formed from a solder alloy such as SnAg, for example. A solder alloy may not be formed on the UBMs 16 as the bumps 17, and the UBMs 16 may be subjected to an anti-oxidation treatment which uses Ni, Au, etc.

The alignment marks 15 are formed in a pattern at predetermined positions on the semiconductor element 11. For example, as shown in FIG. 2, a plurality of alignment marks 15 are formed in an area surrounding a region in which the bump electrodes 19 are formed and at positions close to the corners of the semiconductor element 11. Normally, two or more alignment marks 15 are formed for a single semiconductor element 11 to position the semiconductor device 10 with respect to another semiconductor device, a mounting substrate, or the like.

As shown in FIG. 1, the alignment marks 15 are formed in a columnar shape. The height of the columnar alignment marks 15 from the surface of the semiconductor element 11 is equal to or less than the height of the bump electrodes 19 formed on the pad electrodes 12. The alignment marks 15 may have any height that allows the alignment marks 15 to be recognized easily even after the underfill resin 18 is formed and that causes no trouble when the semiconductor device 10 is mounted. For example, the height of the alignment marks 15 may be the same as the height of the underfill resin 18. The height of the alignment marks 15 is preferably equal to or less than the height of the underfill resin 18.

At least one of the plurality of alignment marks 15 formed on the semiconductor element 11 is made of a magnetic material. The alignment marks 15 formed on the semiconductor element 11 are made of a paramagnetic material that becomes ferromagnetic upon magnetization. Materials containing at least one kind selected from iron (Fe), cobalt (Co), and nickel (Ni), for example, may be used as the magnetic material forming the alignment marks 15. Alloys containing two or more kinds selected from the above materials may also be used.

The alignment marks 15 should only be magnetized at the time of positioning performed when the semiconductor device 10 is mounted, and may not necessarily be magnetized at other times. The magnetic material forming the alignment marks 15 may be demagnetized after the mounting. A permanent magnet or an electromagnet, for example, may be used to magnetize the magnetic material. A pulsed laser ablation method (PLD) may also be used. The magnetic material may be demagnetized by heating the magnetic material to the Curie temperature or higher, for example.

The number of the alignment marks 15 is not limited to four as shown in FIG. 2, and may be two or more. In this case, at least one of the alignment marks 15 may be formed from a magnetic material. Particularly preferably, two or more alignment marks 15 are formed from a magnetic material. Still more preferably, all the alignment marks 15 are formed from a magnetic material.

Alignment marks made of a magnetic material and alignment marks made of a non-magnetic material may be used in combination. In this case, the alignment marks 15 formed from a non-magnetic material are preferably formed from the same material as the material of the UBMs 16 such as Ti, TiW, W, or Cu, for example. Such alignment marks 15 may also be formed from a different material from the material of the UBMs 16. The alignment marks formed from a non-magnetic material are also formed to have the same height as the height of the alignment marks made of a magnetic material.

The positions at which the alignment marks 15 are formed are not limited to four locations near the corners of the semiconductor element 11 shown in FIG. 2, and the alignment marks 15 may be formed at desired locations in consideration of the shape of the semiconductor element 11, for example.

In the case where positioning is performed using an optical camera, it is necessary to form the alignment marks on the side of the corners of the semiconductor element with respect to the positions at which the bump electrodes are formed. This is because it is necessary to interpose the optical camera between the semiconductor element 11 and the mounting surface during positioning in order to confirm the respective positions of the alignment marks. In the case where the alignment marks 15 are formed from a magnetic material so that positioning is performed using the magnetic force of the magnetic material, it is not necessary to interpose an optical camera. Therefore, the alignment marks 15 made of a magnetic material provide a great degree of freedom in regard to where they are formed compared to the alignment marks made of a non-magnetic material discussed above. For example, the alignment marks 15 may be formed even at positions at which an optical camera may not be interposed between the semiconductor device 10 and the mounting surface.

When the semiconductor device 10 is mounted to another semiconductor device, a mounting substrate, or the like after the alignment marks 15 made of a magnetic material are magnetized, the semiconductor device 10 is positioned using the magnetic force of the alignment marks 15 with the underfill resin 18 melted in a reflow furnace. In this way, self-alignment is performed during reflow by the magnetic force of the alignment marks 15.

The underfill resin 18 is formed to such a thickness that the connection portions of the bumps 17 and the mounting surface of the semiconductor device 10 are coated with the underfill resin 18 when the semiconductor device 10 is mounted. For example, the thickness of the underfill resin 18 from the surface of the semiconductor element 11 is preferably equal to or larger than the distance between the mounting surface of the semiconductor device 10 after the mounting and the mounting surface of a semiconductor device, a mounting substrate, or the like to which the semiconductor device 10 is mounted. With a space between the semiconductor device 10 and the mounting substrate or the like filled with the underfill resin 18, it is possible to secure the mounting reliability.

A thermosetting resin in which a phenolic, amine, or acid anhydride curing agent is used, for example, is preferably used as the underfill resin 18. In consideration of self-alignability during reflow, the underfill resin 18 preferably has a minimum melt viscosity of 0.01 Pa·s to 10 Pa·s. If the melt viscosity of the resin is too low, the underfill resin 18 may have a significantly high flowability to flow out of the mounting surface of the semiconductor device 10. If the melt viscosity of the resin is too high, meanwhile, the resin may have a low flowability to resist self-alignment due to the magnetic force of the alignment marks 15 during reflow.

The underfill resin 18 preferably contains a material having flux activity. The underfill resin 18 provided with flux activity is first melted during reflow to reduce an oxide film on the surface of the bumps 17. Then, the upper and lower bumps are caused to contact each other by the attracting force of the alignment marks 15 made of a magnetic material to form metal connections.

While the alignment marks 15 are formed on the passivation layer 13 in the semiconductor device 10, the alignment marks 15 may also be formed on the same surface as the pad electrodes 12. In this case, the alignment marks 15 may be formed from the same material as the material of the pad electrodes 12.

Figure 3:
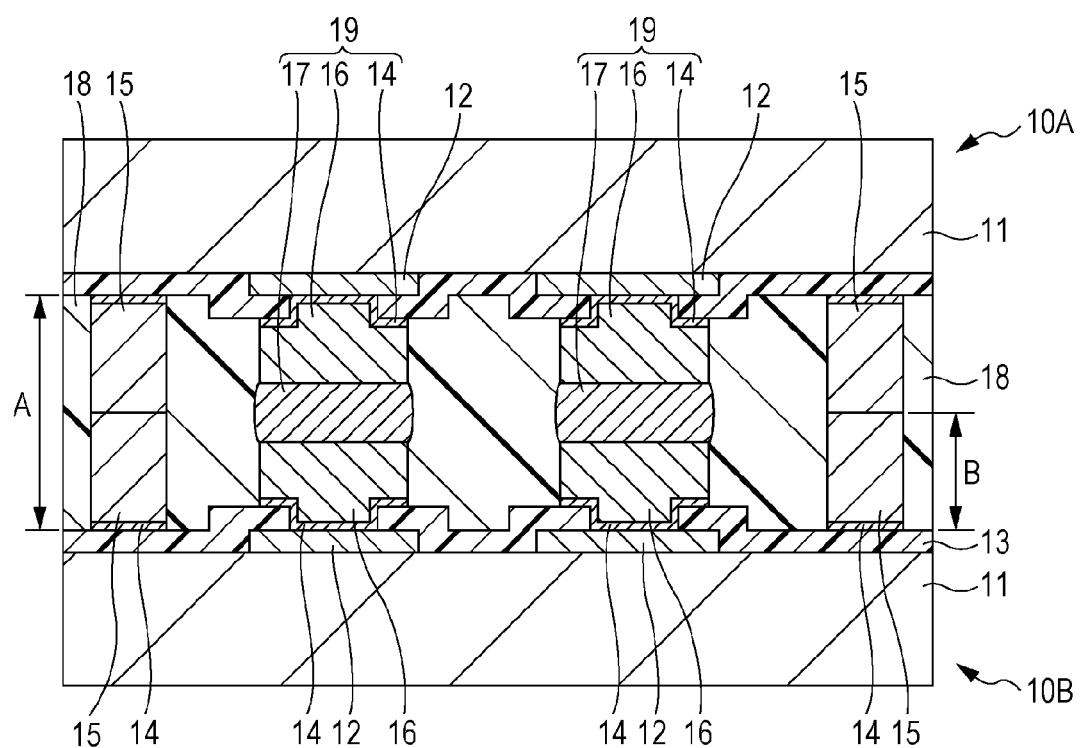
FIG. 3 shows a state in which semiconductor devices according to the first embodiment are connected to each other through bump electrodes.

FIG. 3 shows a state in which the semiconductor devices 10 discussed above are connected to each other through the bump electrodes 19.

In the configuration shown in FIG. 3, the semiconductor devices 10 having the same configuration are disposed with their surfaces on which the bump electrodes 19 are formed facing each other. An upper semiconductor device 10A and a lower semiconductor device 10B are connected to each other through their respective bump electrodes 19. The bump electrodes 19 are integrated with each other with the bumps 17 forming their surfaces spread to electrically connect the upper semiconductor device 10A and the lower semiconductor device 10B.

The underfill resin 18 mechanically connects the upper semiconductor device 10A and the lower semiconductor device 10B to each other such that the connection portions formed by the bump electrodes 19 are formed in the underfill resin 18. In this way, the underfill resin 18 fills a space between the upper semiconductor device 10A and the lower semiconductor device 10B to form a fillet.

The upper semiconductor device 10A and the lower semiconductor device 10B are disposed with their respective alignment marks 15 formed on the semiconductor elements 11 positioned with respect to each other.

By providing connection surfaces with the alignment marks 15 made of a magnetic material and magnetizing the magnetic material, the alignment marks 15 may be accurately positioned with respect to each other using the attracting magnetic force of the magnetic material. Therefore, it is possible to accurately position the upper semiconductor device 10A and the lower semiconductor device 10B without using an optical camera or the like.

In particular, in the case where two or more alignment marks 15 are formed from a magnetic material, a high positioning accuracy may be achieved using only the magnetic force.

As discussed above, alignment marks made of a magnetic material are formed on the respective semiconductor elements 11 of the upper semiconductor device 10A and the lower semiconductor device 10B which are subjected to flip-chip bonding in which the bump electrodes are used, for example. Therefore, when the bumps are melted in a reflow process after the upper and lower semiconductor elements are positioned using the magnetic force, the semiconductor elements 11 are moved to correct positions by the attracting force of the magnetic material. This enables high-accuracy positioning through self-alignment.

In the configuration shown in FIG. 3, further, opposite magnetic fields are applied to the respective magnetic materials formed in the upper and lower semiconductor elements, and the underfill resin 18 containing a flux activating component is formed in advance on at least one of the upper and lower semiconductor elements 11. Since the underfill resin 18 having flux activity is formed in advance on the surface of the semiconductor device 10, self-alignment in which bump connection and positioning based on the attraction of the magnetic material are performed at the same time is performed during the reflow process. In particular, positioning may be performed in a reduced tact time and with an improved accuracy for connection which uses micro-bumps of 20 μm or less, for which the positioning accuracy may not be improved in an optical manner because of the limitation of the accuracy of optical cameras.

Use of the underfill resin having flux activity and a minimum melt viscosity of 0.01 Pa·s to 10 Pa·s at the reflow temperature reduces the resistance of the resin during reflow, and facilitates positioning based on the attracting force of the magnetized magnetic material.

Further, the alignment marks made of a magnetic material may be demagnetized to have no magnetic force any more after the semiconductor devices 10 are connected to each other. This prevents an erroneous operation etc. of the semiconductor devices 10 due to a magnetic force after the connection.

Next, the height of the alignment marks 15 in the semiconductor device 10 will be described.

As shown in FIG. 3, the height B of the alignment marks 15 formed on the upper and lower semiconductor elements 11 is adjusted such that the distance A between the upper and lower semiconductor elements 11 with their respective magnetic materials or permanent magnets contacting each other allows the respective bumps 17 to contact each other to secure electrical connection.

As the height B of the alignment marks 15, the height of the columnar alignment marks 15 from the surface of the semiconductor element 11 may be equal to or less than the height of the bump electrodes 19 formed on the pad electrodes 12 and equal to or more than the height of the surface on which the bumps 17 are formed, for example. In the configuration shown in FIG. 3, the bumps 17 are formed on the UBMs 16. Therefore, the height of the alignment marks 15 may be equal to or more than the height of the UBMs 16 and equal to or less than the height of the bumps 17. In a configuration in which a solder alloy etc. is not formed on the UBMs 16 as the bumps 17, for example, the height of the alignment marks 15 may be equal to or more than the height of the pad electrodes 12 and equal to or less than the height of the UBMs 16. In particular, the height of the alignment marks 15 is preferably the same as the height of the UBMs 16.

The alignment marks 15 may have any height that causes no trouble when the semiconductor device 10 is mounted. For example, the height of the alignment marks 15 is preferably equal to or less than the height of the underfill resin 18.

The alignment marks 15 on the upper and lower semiconductor elements may not be formed to have the same height, and the alignment marks 15 on one of the semiconductor elements may be shorter, for example. The respective heights of the alignment marks 15 on the upper semiconductor device 10A and the lower semiconductor device 10B are not specifically limited as long as the total of the height of the alignment marks 15 on the upper semiconductor device 10A and the height of the alignment marks 15 on the lower semiconductor device 10B with the semiconductor elements connected to each other secures the distance A discussed above.

In the embodiment discussed above, the semiconductor devices 10 having the same configuration are connected to each other. However, the semiconductor device 10 may be connected to an object other than the semiconductor device 10. The semiconductor device 10 may be connected to a semiconductor device, a circuit substrate, or the like having a different configuration that includes alignment marks made of a magnetic material as with those of the semiconductor device 10. Of a pair of alignment marks made of a magnetic material and corresponding to each other in position, one of the pair may not be magnetized if the other has a magnetic force.

<2. Manufacturing Method for Semiconductor Device According to First Embodiment>

Next, a manufacturing method for the semiconductor device according to the first embodiment will be described. In the following description of the manufacturing method, components similar to those of the semiconductor device according to the first embodiment discussed above are denoted by the same reference numerals as those used in FIGS. 1 to 3 to omit a detailed description of the components. Only one of a plurality of semiconductor elements formed on a semiconductor substrate is shown in cross section to be described below.

Figure 4A:
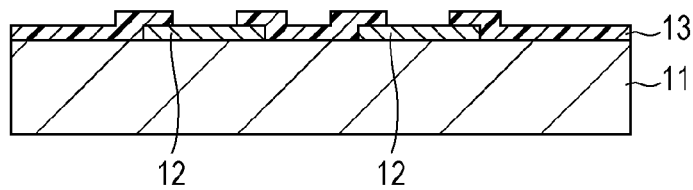
FIGS. 4A to 4E illustrate a manufacturing method for the semiconductor device according to the first embodiment.

First, as shown in FIG. 4A, a semiconductor substrate in which pad electrodes 12 and a passivation layer 13 are formed on a semiconductor element 11 is prepared. Then, reverse sputtering is performed on a surface of the semiconductor element 11 on the substrate to remove an oxide film etc. on surfaces of the pad electrodes 12.

Figure 4B:
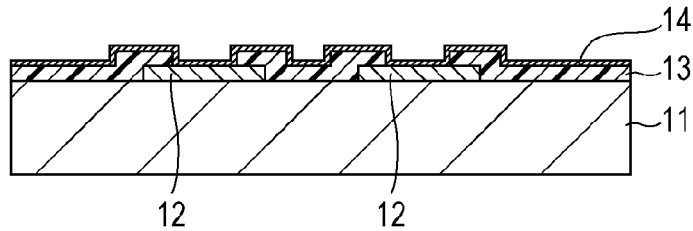

Next, as shown in FIG. 4B, the pad electrodes 12 and the passivation layer 13 are coated using a sputtering method to form a barrier layer 14 all over the semiconductor element 11. The barrier layer 14 is formed, for example, by forming a Ti layer on the pad electrodes 12 and the passivation layer 13 using a sputtering method, and then forming a Cu layer also using a sputtering method to coat the Ti layer.

Figure 4C:
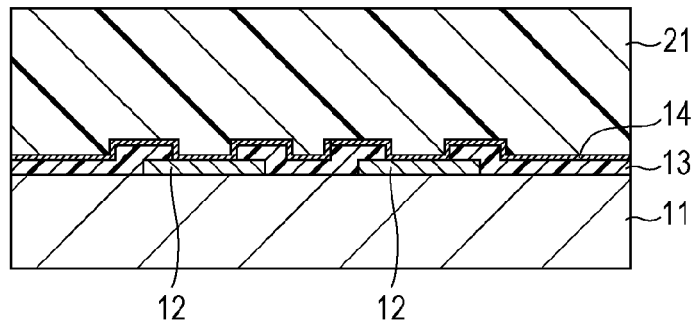

Next, as shown in FIG. 4C, a photoresist layer 21 is formed on the barrier layer 14. The photoresist layer 21 is formed by applying a photosensitive resist material to cover the entire surface of the substrate using a spin coat method, for example, and then drying the applied film. The photoresist layer 21 is formed to have a thickness larger than the height of alignment marks 15 to be formed on the semiconductor element 11.

Figure 4D:
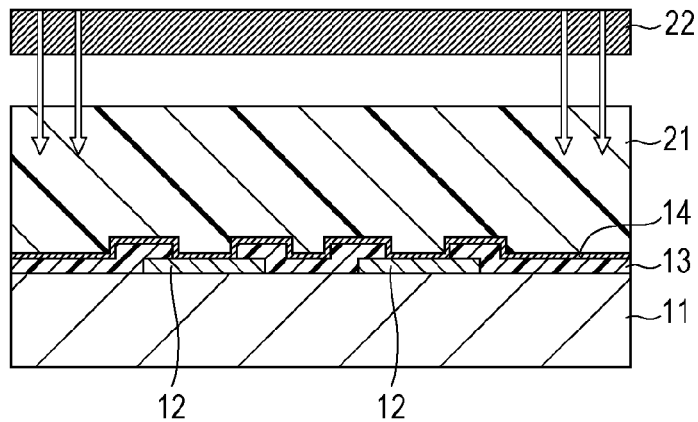

Next, as shown in FIG. 4D, an exposure process is performed on the photoresist layer 21 using a photomask 22.

Figure 4E:
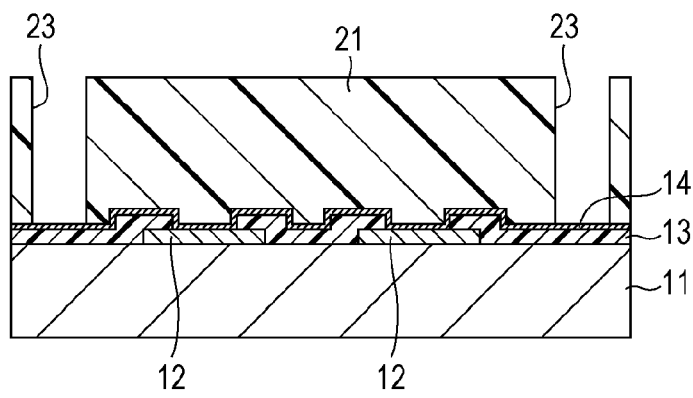

A pattern that allows regions in which alignment marks are to be formed to be irradiated with exposure light is used as the photomask 22. Then, as shown in FIG. 4E, the photoresist layer 21 is subjected to a development process to remove exposed portions of the photoresist layer 21 to form opening portions 23 in the photoresist layer 21. The opening portions 23 are formed at positions corresponding to the positions at which alignment marks are to be formed.

Figure 5F:
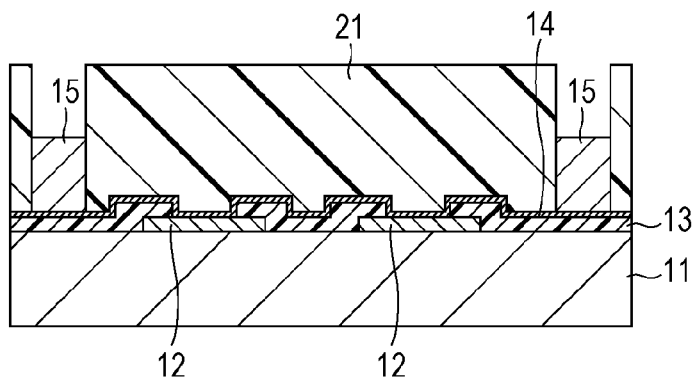
FIGS. 5F to 5I illustrate the manufacturing method for the semiconductor device according to the first embodiment.

Next, as shown in FIG. 5F, alignment marks 15 are formed in the opening portions 23 of the photoresist layer 21 using an electrolytic plating method. At least one of the alignment marks 15 formed on the semiconductor element 11 is formed using a magnetic material. This results in formation of the alignment marks 15 on the semiconductor element 11 and the barrier layer 14.

In the case where the alignment marks 15 are formed from a magnetic material, the alignment marks 15 are formed as a plated layer containing at least one kind selected from Ni, Fe, and Co.

In the case where the alignment marks 15 made of a magnetic material and the alignment marks 15 made of a non-magnetic material are used in combination, the alignment marks 15 made of a non-magnetic material are formed as a plated layer of Ti, TiW, W, Cu, or the like, for example.

The height of the alignment marks 15 is equal to or less than the height of bump electrodes 19 to be formed on the pad electrodes 12, and equal to or more than the height of a surface on which bumps 17 are to be formed. In the case where a solder alloy etc. is not formed on UBMs 16 as bumps 17, the height of the alignment marks 15 is the same as the height of the UBMs 16.

Figure 5G:
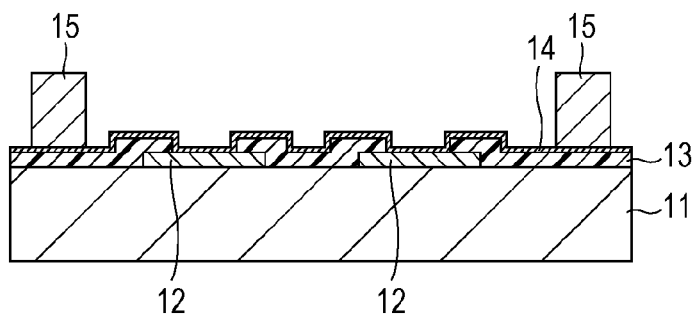
Figure 5H:
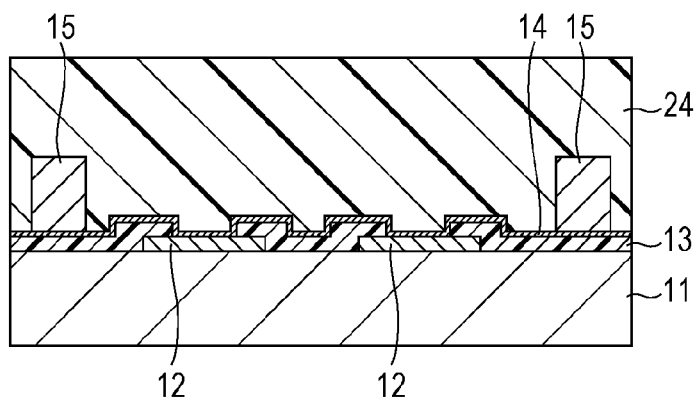

Next, as shown in FIG. 5G, the photoresist layer 21 on the semiconductor element 11 is removed. Then, as shown in FIG. 5H, a photoresist layer 24 is formed on the barrier layer 14. The photoresist layer 24 is formed by applying a material to cover a surface of the substrate and the alignment marks 15 using a spin coat method, for example, and then drying the applied film.

Figure 5I:
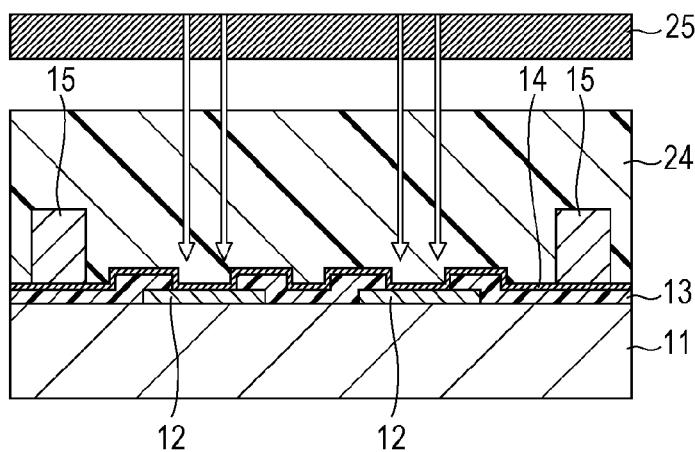

Next, as shown in FIG. 5I, an exposure process is performed on the photoresist layer 24 using a photomask 25. A pattern that allows the respective center portions of the pad electrodes 12 to be irradiated with exposure light is used as the photomask 25. Then, after exposure, the photoresist layer 24 is subjected to a development process to remove exposed portions to form opening portions 26 in the photoresist layer 24.

Figure 6J:
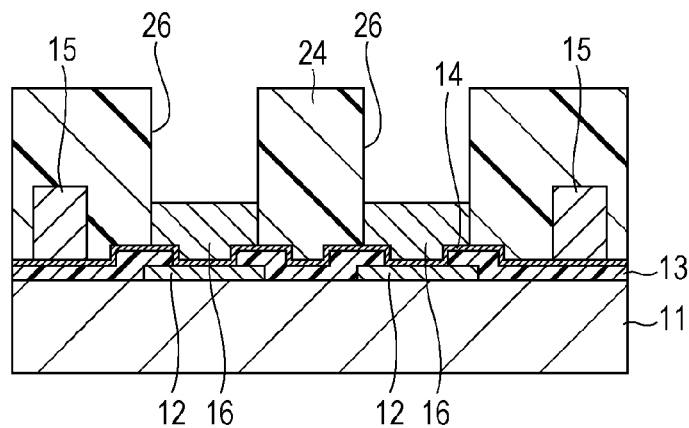
FIGS. 6J to 6M illustrate the manufacturing method for the semiconductor device according to the first embodiment.
Figure 6K:
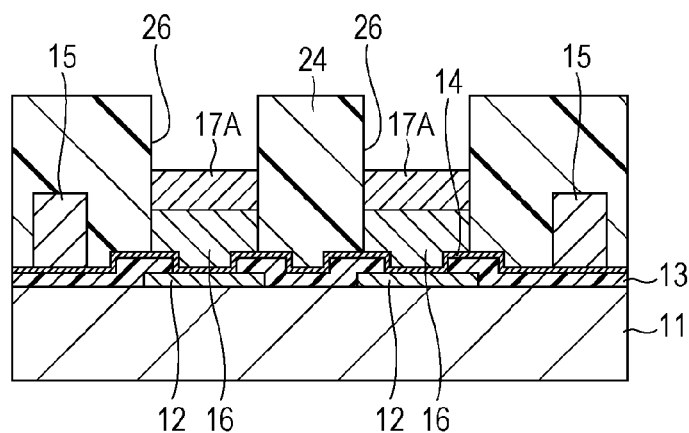

Then, as shown in FIG. 6J, UBMs 16 are formed in the opening portions 26 using an electrolytic plating method. Further, as shown in FIG. 6K, solder layers 17A are formed on the UBMs 16 in the opening portions 26 using an electrolytic plating method. The UBMs 16 are formed as electrolytic plating of Ni, Ti, TiW, W, or Cu, for example. The solder layers 17A are formed as electrolytic plating of a solder alloy such as SnAg.

Figure 6L:
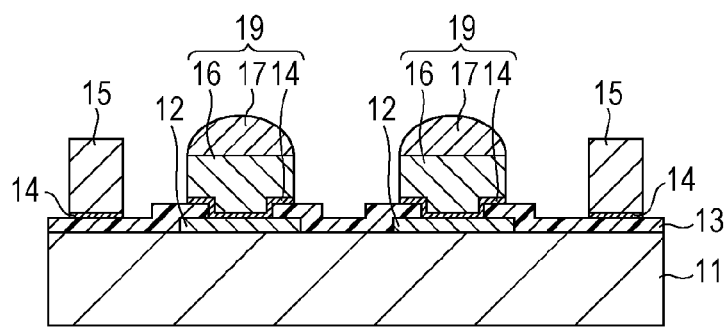

Next, the photoresist layer 24 is removed, and thereafter the barrier layer 14 exposed to the surface of the semiconductor element 11 is removed by sputter etching. Then, as shown in FIG. 6L, the solder layers 17A are melted by reflow to form bumps 17. In the removal of the barrier layer 14, the UBMs 16 and the solder layers 17A serve as masks for the entire surface of the substrate so that the barrier layers 14 remain under the UBMs 16. The alignment marks 15 also serve as etching masks so that the barrier layers 14 also remain under the alignment marks 15. By forming the solder layers 17A into hemispherical bumps 17 by reflow, bump electrodes 19 formed from the UBMs 16 and the bumps 17 are formed on the pad electrodes 12.

In this state, the alignment marks are magnetized in the case where the alignment marks are formed from a paramagnetic material.

A permanent magnet or an electromagnet, for example, is used to magnetize the alignment marks 15. A pulsed laser ablation method (PLD) is alternatively used. As a result of this process, a magnetic field is applied to the magnetic material. The magnetic field is applied with magnetic flux directed perpendicularly to the surface of the semiconductor element 11. The alignment marks 15 are magnetized such that the magnetic polarity of the alignment marks 15 of the semiconductor device 10 is opposite to the magnetic polarity of alignment marks of a device to which the semiconductor device 10 is to be mounted.

Figure 6M:
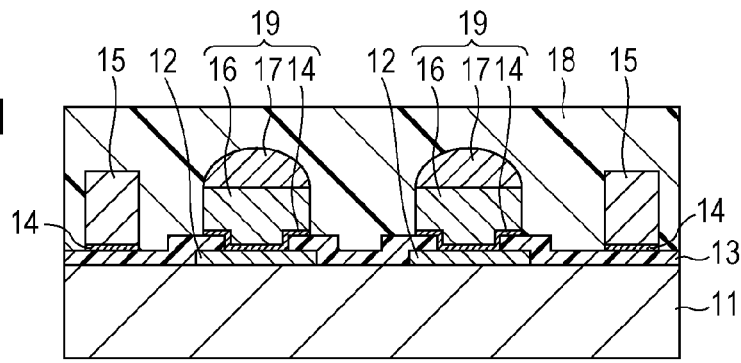

Next, as shown in FIG. 6M, an underfill resin 18 is formed on a surface of the substrate on the semiconductor element 11 side. The underfill resin 18 is formed, for example, by applying a liquid containing an underfill resin by a spin coat method or laminating a dry film of an underfill resin. Then, the semiconductor element 11 is cut from the substrate to be divided into individual pieces to manufacture a semiconductor device 10.

In the manner described above, the alignment marks 15, the UBMs 16, and the solder bumps 17 are formed on a surface of the substrate on which the semiconductor element 11 is formed using photolithography and electrolytic plating. The alignment marks 15 are formed such that the height of their upper surfaces is equal to or less than the height of the bump electrodes 19 from the surface on which the semiconductor element 11 is formed. When the surface of the semiconductor element 11 on which the bump electrodes 19 are formed is coated with the underfill resin 18, the alignment marks 15 are also coated at the same time. At this time, the underfill resin 18 is formed to have a thickness equal to or more than the height of the alignment marks 15.

In the manufacturing method discussed above, the magnetization process for the magnetic material forming the alignment marks 15 is performed before the semiconductor element 11 is cut from the substrate to be divided into individual pieces. However, the magnetization process for the magnetic material may be performed any time after the alignment marks 15 are formed. For example, the magnetization process for the magnetic material may be performed after the semiconductor element 11 is divided into individual pieces.

In the manufacturing method according to the embodiment discussed above, the alignment marks 15 are fabricated before the formation process for the UBMs 16 and the solder layers 17A. However, the order of the formation process for the UBMs 16 and the solder layers 17A and the formation process for the alignment marks 15 is not specifically limited. The formation process for the alignment marks 15 and the formation process for the UBMs 16 and the solder layers 17A may be performed in any order after the formation process for the barrier layer 14 and before the etching process for the barrier layer 14.

Next, a method for connection of the semiconductor device 10 formed by the manufacturing method discussed above will be described. In the following description, connection of two semiconductor devices 10 having the same configuration with their respective surfaces on which the bump electrodes 19 are formed facing each other will be described as an example of the connection of the semiconductor device 10.

Figure 7N:
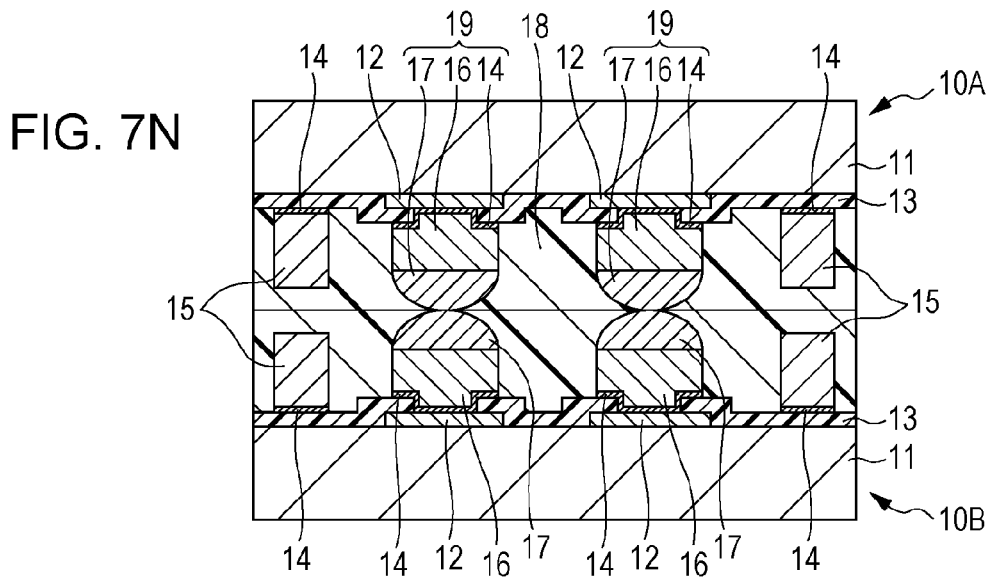
FIGS. 7N to 7P illustrate a method for connection of the semiconductor device according to the first embodiment.

First, as shown in FIG. 7N, the upper semiconductor device 10A and the lower semiconductor device 10B are positioned with respect to each other. This positioning is performed using the magnetic materials having different polarities and provided in the alignment marks 15 without performing the optical positioning. This enables the upper semiconductor device 10A and the lower semiconductor device 10B to be positioned on the basis of the attracting magnetic force even in the case where the semiconductor devices are caused to contact each other with a relatively low positioning accuracy.

Figure 7O:
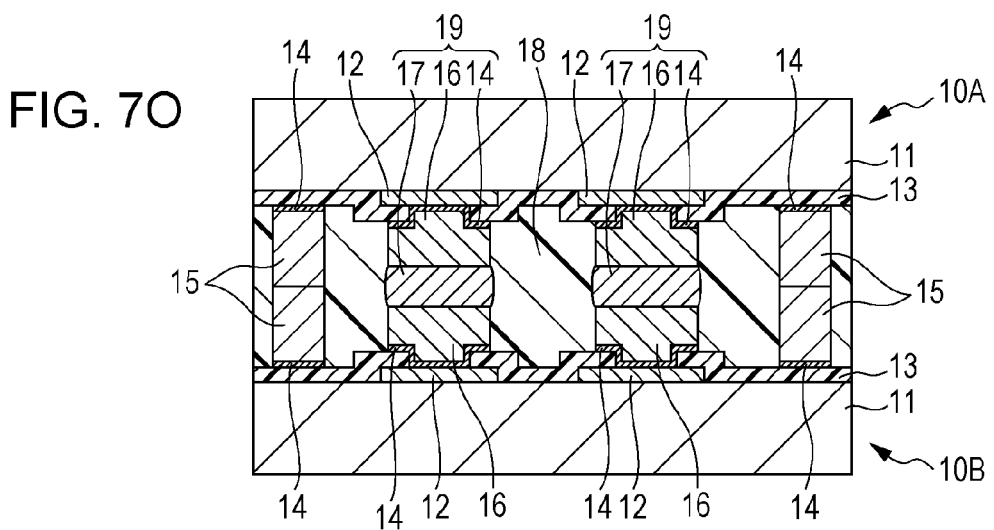
Figure 7P:
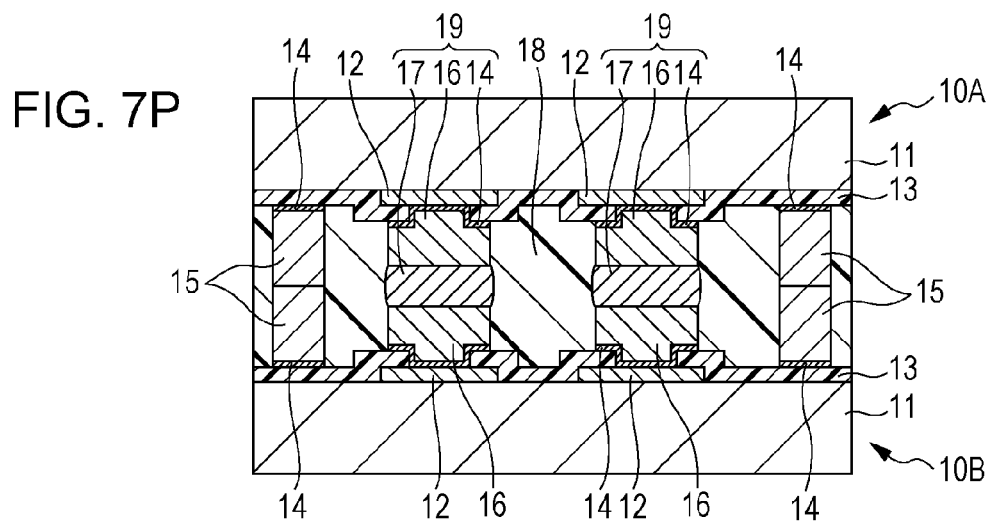

Next, as shown in FIG. 7O, the upper semiconductor device 10A and the lower semiconductor device 10B are heated in a reflow furnace while being positioned with respect to each other. During the reflow, heating is performed to the melting point of the bumps 17 or higher to melt the bumps 17 for connection. For example, in the case where the bumps 17 are made of Sn-3.5Ag, heating is performed to the melting point of 221° C. or higher. In this event, the underfill resin 18 containing a flux activating component is melted before the bumps 17 so that the oxide film on the surfaces of the bumps 17 is reduced during the reflow. Then, the upper and lower bumps 17 are caused to contact each other by the attracting magnetic force of the alignment marks 15 made of a magnetic material to form metal connections.

Further, the underfill resin 18 is heated to be cured. The underfill resin 18 bonds the upper semiconductor device 10A and the lower semiconductor device 10B to each other to improve the reliability of mechanical connection between the respective bonding surfaces of the semiconductor elements. The heating for curing of the underfill resin 18 may be performed at the same time as the reflow for connection of the bumps 17 discussed above.

When the bumps 17 are melted by the reflow and further the underfill resin 18 becomes fluidic as discussed above, the upper semiconductor device 10A and the lower semiconductor device 10B become freely movable. Therefore, the respective positions of the upper semiconductor device 10A and the lower semiconductor device 10B are finely adjusted and corrected by the attracting magnetic force of the alignment marks 15. In this way, with the alignment marks 15 made of a magnetic material, self-alignment based on the magnetic force is performed during the reflow besides initial positioning performed before the reflow to cause the upper semiconductor device 10A and the lower semiconductor device 10B to contact each other.

The semiconductor devices 10 may be connected to each other using positioning based on the magnetic force of the magnetic material forming the alignment marks 15 through the processes described above.

The alignment marks 15 made of a magnetic material may be demagnetized after the upper semiconductor device 10A and the lower semiconductor device 10B are connected to each other. The alignment marks 15 may be demagnetized by heating the alignment marks 15 to the Curie temperature of the material used as the magnetic material or higher. By demagnetizing the alignment marks 15, it is possible to prevent an erroneous operation of the semiconductor device due to the magnetic force.

<3. Semiconductor Device According to Second Embodiment>

Next, a semiconductor device according to a second embodiment will be described.

The positioning based on the alignment marks made of a magnetic material according to the embodiment of the present technology may also be applied to connection between semiconductor substrates which utilizes three-dimensional connection between metal electrodes, besides the flip-chip bonding between semiconductor elements which uses bumps described in relation to the first embodiment discussed above.

Figure 8:
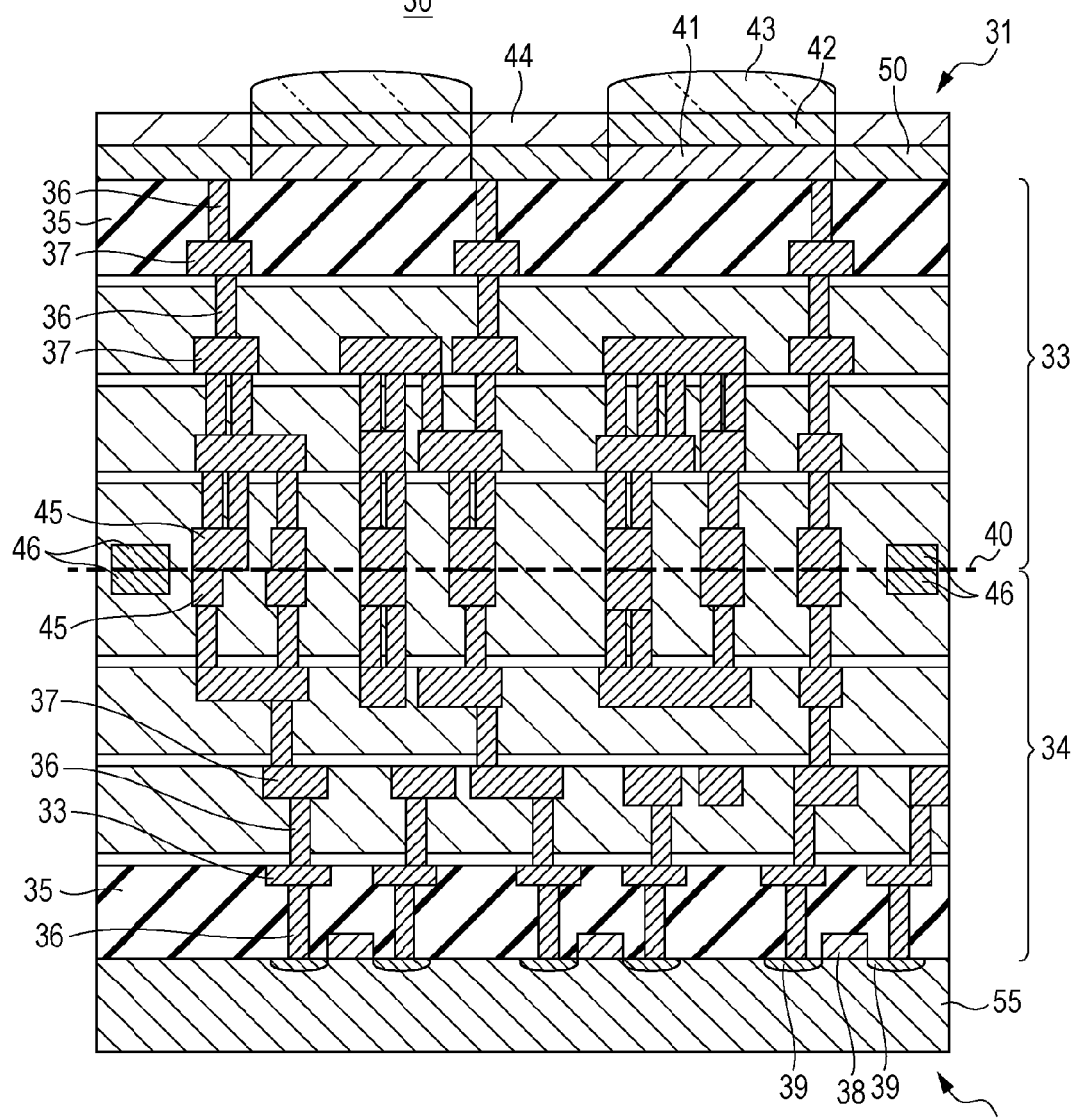
FIG. 8 is a cross-sectional view showing the configuration of a semiconductor device according to a second embodiment.

FIG. 8 shows a semiconductor device 30, in which a first semiconductor device 31 and a second semiconductor device 32 are connected through metal electrodes 45, as an example of the semiconductor devices connected through metal electrodes.

The semiconductor device 30 shown in FIG. 8 includes the first semiconductor device 31 including a pixel region in which a plurality of pixels are arranged, and the second semiconductor device 32 including a logic circuit that performs signal processing. The first semiconductor device 31 and the second semiconductor device 32 are electrically connected to each other through the metal electrodes 45 to form a single solid-state imaging device.

The first semiconductor device 31 includes a first semiconductor substrate 50. The first semiconductor substrate 50 includes a photoelectric conversion section 41 provided in the pixel region and including a photodiode (PD) serving as a photoelectric conversion section for each pixel, a source/drain region of each pixel transistor, and a gate electrode formed on the first semiconductor substrate 50. A flattening film 44 is formed on a surface of the first semiconductor substrate 50 opposite to a surface of the first semiconductor device 31 connected to the second semiconductor device 32. A color filter 42 and an on-chip micro-lens 43 are stacked in this order on the photoelectric conversion section 41.

A wiring layer 33 is formed on a surface of the first semiconductor substrate 50 on the side on which the first semiconductor device 31 is connected to the second semiconductor device 32. The wiring layer 33 includes a plurality of insulation layers 35, wiring formed from conductive layers 37 formed in each of the insulation layers 35, and connection conductors 36 that electrically connect the conductive layers 37 across the layers.

The metal electrodes 45 for connection are formed on a surface 40 of the wiring layer 33 (surface opposite to the first semiconductor substrate 50). Alignment marks 46 are formed to surround the metal electrodes 45.

The second semiconductor device 32 includes a second semiconductor substrate 55. A logic circuit including a signal processing circuit for signal processing is formed on the second semiconductor substrate 55. A plurality of MOS transistors forming the logic circuit are provided on a surface of the second semiconductor substrate 55 on the side on which the second semiconductor device 32 is connected to the first semiconductor device 31. Each of the MOS transistors includes a pair of source/drain regions 39 separated by an element separation region, and a gate electrode 38 formed via a gate insulation film.

A wiring layer 34 is formed on the second semiconductor substrate 55. The wiring layer 34 includes a plurality of insulation layers 35, wiring formed from conductive layers 37 formed in each of the insulation layers 35, and connection conductors 36 that electrically connect the conductive layers 37 across the layers.

The metal electrodes 45 for connection are formed on a foremost surface 40 of the wiring layer 34 (surface opposite to the second semiconductor substrate 55). Alignment marks 46 are formed to surround the metal electrodes 45. The metal electrodes 45 and the alignment marks 46 formed in the second semiconductor device 32 are formed at positions corresponding to the positions of the metal electrodes 45 for connection and the alignment marks 46 of the first semiconductor device 31 discussed above.

Figure 9:
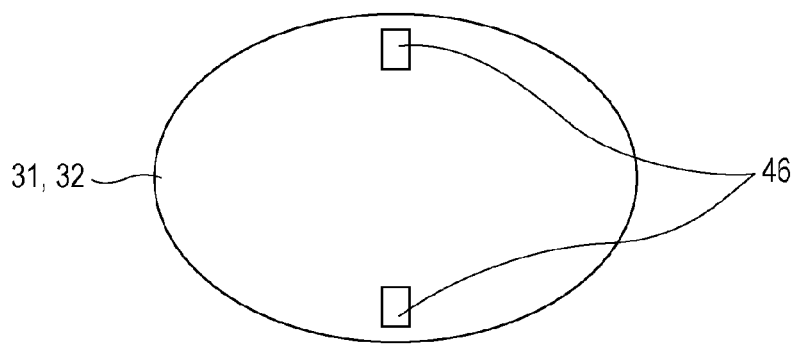
FIG. 9 is a plan view showing the configuration of a surface of the semiconductor device according to the second embodiment on which alignment marks are formed.

As shown in FIG. 9, a plurality of alignment marks 46 are formed at positions close to the peripheral portion of the first semiconductor device 31 and the second semiconductor device 32 (hereinafter referred to as "semiconductor device 31, 32"). Normally, two or more alignment marks 46 are formed for a single semiconductor substrate.

As shown in FIG. 8, the alignment marks 46 are formed to be embedded in the insulation layer 35 forming a surface of the wiring layer 33 such that the surfaces of the alignment marks 46 have the same height as those of the metal electrodes 45 for connection. The alignment marks 46 may have any height that enables positioning based on a magnetic force and that causes no trouble when the semiconductor devices 31 and 32 are connected to each other. Preferably, the alignment marks 46 are embedded in the insulation layer 35 as shown in FIG. 8. Alternatively, the alignment marks 46 may be formed to project from the surface of the insulation layer 35. In this case, a liquid resin may be injected to fill any gap formed after connection. The alignment marks 46 projecting farther than the metal electrodes 45 for connection make connection difficult, and therefore are not preferable.

At least one of the plurality of alignment marks 46 formed on the semiconductor element 31, 32 is made of a magnetic material. Particularly preferably, two or more alignment marks 46 are formed from a magnetic material. Still more preferably, all of the plurality of alignment marks 46 are formed from a magnetic material.

The alignment marks 46 formed on the semiconductor device 31, 32 are made of a paramagnetic material, and should only be magnetized at the time of positioning performed when the semiconductor device 31, 32 is mounted, and may not necessarily be magnetized at other times. The magnetic material forming the alignment marks 46 may be demagnetized after the mounting.

Materials containing at least one kind selected from iron (Fe), cobalt (Co), and nickel (Ni), for example, may be used as the magnetic material forming the alignment marks 46. Alloys containing two or more kinds selected from the above materials may also be used.

With the alignment marks 46 formed from a magnetic material, positioning between the semiconductor devices 31 and 32 may be performed through self-alignment. This enables high-accuracy positioning without optical positioning.

The positioning based on the alignment marks discussed above is not limited to application to a specific type of connection, and may be applied to any type of connection between substrates, besides the connection through the metal electrodes discussed above. For example, such positioning may also be applied to connection between substrates through plasma connection.

<4. Manufacturing Method for Semiconductor Device According to Second Embodiment>

Next, a manufacturing method for the semiconductor device according to the second embodiment will be described. In the following description of the manufacturing method, components similar to those of the semiconductor device according to the first embodiment discussed above are denoted by the same reference numerals as those used in FIGS. 8 and 9 to omit a detailed description of the components.

In the following description, only a method of forming alignment marks in a wiring layer on a semiconductor substrate of the first semiconductor device 31 discussed above will be described as an example of the manufacturing method for the semiconductor device. A method of forming the semiconductor substrate, the wiring layer, and various elements formed on the semiconductor substrate and in the wiring layer will not be described. The semiconductor substrate, the wiring layer, the metal electrodes, and so forth may be manufactured by a method according to the related art. Also for the second semiconductor device 32, alignment marks may be formed in the same manner as for the first semiconductor device 31, and the semiconductor substrate, the wiring layer, the metal electrodes, and so forth may be manufactured by a method according to the related art.

Figure 10A:
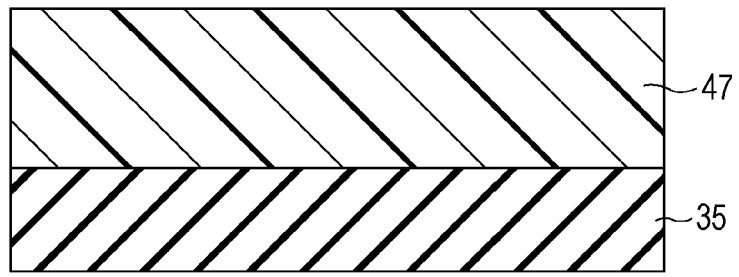
FIGS. 10A to 10D illustrate a manufacturing method for the semiconductor device according to the second embodiment.

First, a wiring layer 33 (not shown) is formed on a first semiconductor substrate 50 by a method according to the related art. Then, after a foremost insulation layer 35 is formed, a photoresist layer 47 is formed on the insulation layer 35 as shown in FIG. 10A. The photoresist layer 47 is formed by applying a photosensitive resist material to cover the entire surface of the first semiconductor substrate 50 using a spin coat method, for example, and then drying the applied film.

Figure 10B:
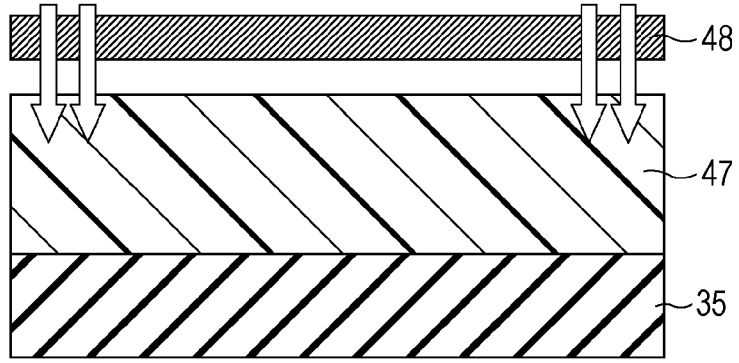

Next, as shown in FIG. 10B, an exposure process is performed on the photoresist layer 47 using a photomask 48. A pattern that allows regions in which alignment marks are to be formed to be irradiated with exposure light is used as the photomask 48. Then, as shown in FIG. 10C, the photoresist layer 47 is subjected to a development process to remove exposed portions of the photoresist layer 47 to form opening portions 49 in the photoresist layer 47.

Figure 10C:
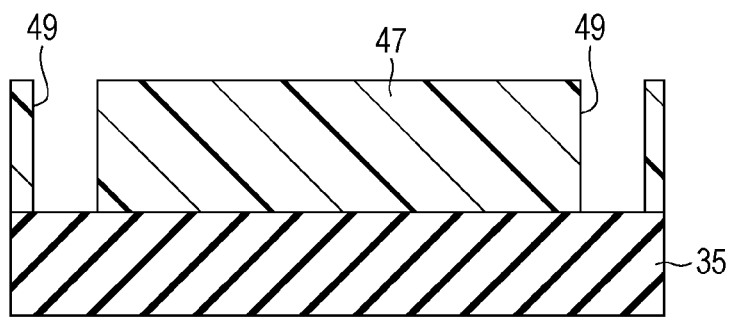
Figure 10D:
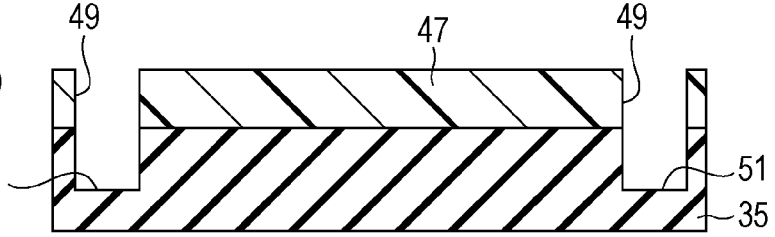
Figure 11E:
FIGS. 11E to 11I illustrate the manufacturing method for the semiconductor device according to the second embodiment.

Next, as shown in FIG. 10C, the insulation layer 35 exposed from the opening portions 49 of the photoresist layer 47 is removed by dry etching. By removing the insulation layer 35 in the opening portions 49, recessed portions 51 are formed in the insulation layer 35 at positions at which alignment marks are to be formed. Then, as shown in FIG. 11E, the photoresist layer 47 is peeled from the insulation layer 35.

Figure 11F:
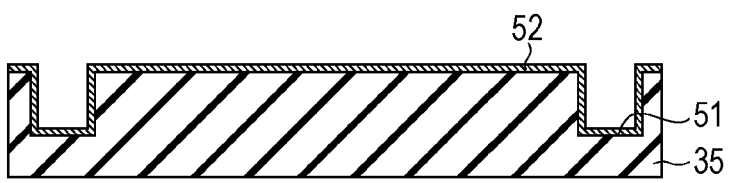

After the photoresist layer 47 is peeled, the surface of the insulation layer 35 and the surface defining the recessed portions 51 of the insulation layer 35 are coated using a sputtering method to form a barrier layer 52 as shown in FIG. 11F. The barrier layer 52 is formed, for example, by forming a Ti layer on the insulation layer 35 using a sputtering method, and then forming a Cu layer also using a sputtering method to coat the Ti layer.

Figure 11G:
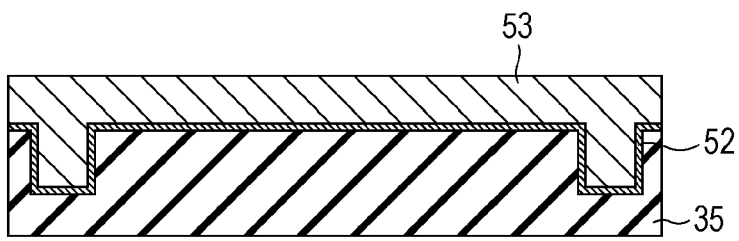

Next, as shown in FIG. 11G, a plated layer 53 that is to form alignment marks is formed on the surface of the insulation layer 35 and in the recessed portions 51 of the insulation layer 35 using an electrolytic plating method. In this event, the plated layer 53 made of a magnetic material is formed in at least one of the recessed portions 51. In the case where alignment marks 46 made of a magnetic material are to be formed, the plated layer 53 is formed using at least one kind selected from Ni, Fe, and Co. In the case where alignment marks 46 made of a magnetic material and alignment marks 46 made of a non-magnetic material are to be formed in combination, the plated layer 53 may be formed by a plurality of electrolytic plating processes. In this case, desired recessed portions 51 are covered with a resist or the like to select which recessed portions 51 to be filled with the plated layer 53. In the case where alignment marks 46 made of a non-magnetic material are to be formed, the plated layer 53 is formed from Ti, TiW, W, Cu, or the like, for example.

Figure 11H:
Figure 11I:
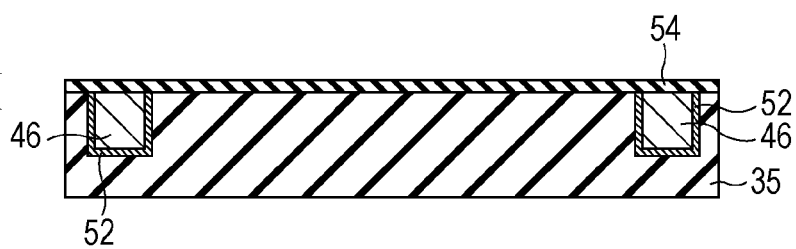

Next, as shown in FIG. 11H, the plated layer 53 formed on the insulation layer 35 is removed by a chemical mechanical polishing (CMP) method so that the plated layer 53 remains only in the recessed portions 51 to form alignment marks 46. The alignment marks 46 may be formed in the first semiconductor device 31 through the processes described above. After the alignment marks 46 are formed, an insulation layer 54 may be formed on the surface of the first semiconductor device 31 as shown in FIG. 11I in order to protect the surface of the first semiconductor device 31.

Next, a method for connection of the semiconductor device fabricated through the processes discussed above will be described.

First, a first semiconductor device 31 in which alignment marks 46 are formed as discussed above and a second semiconductor device 32 including electrodes 45 and alignment marks 46 corresponding to those of the first semiconductor device 31 are prepared.

Then, the first semiconductor device 31 and the second semiconductor device 32 are positioned with respect to each other. In the case where the alignment marks 46 are formed from a paramagnetic material, the magnetic material is magnetized to perform positioning based on the magnetic force of the magnetic material. By performing positioning using the magnetic materials having different polarities, the respective positions of the first semiconductor device 31 and the second semiconductor device 32 are corrected by the attracting magnetic force to enable high-accuracy positioning even in the case where the semiconductor devices are caused to contact each other with a relatively low positioning accuracy.

Next, after the first semiconductor device 31 and the second semiconductor device 32 are positioned with respect to each other, a heat treatment is performed at a temperature of 300° C. to 600° C. with their respective metal electrodes 45 contacting each other. This allows the metal electrodes 45 to be joined to each other so that the first semiconductor device 31 and the second semiconductor device 32 are electrically and mechanically connected to each other.

The semiconductor device 30 formed from the first semiconductor device 31 and the second semiconductor device 32 shown in FIG. 8 may be manufactured through the processes described above. The alignment marks 46 made of a magnetic material may be demagnetized after the semiconductor device 30 is formed. The demagnetization may be performed at the same time as the heating process discussed above in which the metal electrodes 45 are joined to each other. In the case where the magnetic material is made of Ni and the metal electrodes 45 are made of Cu, for example, the Curie temperature of Ni, which is 627° C., and the joining temperature for the Cu electrodes are close to each other, and therefore the demagnetization and the joining may be performed in the same process.

<5. Electronic Device According to Embodiment>

Next, an electronic device according to an embodiment including the solid-state imaging device discussed above will be described.

Figure 12:
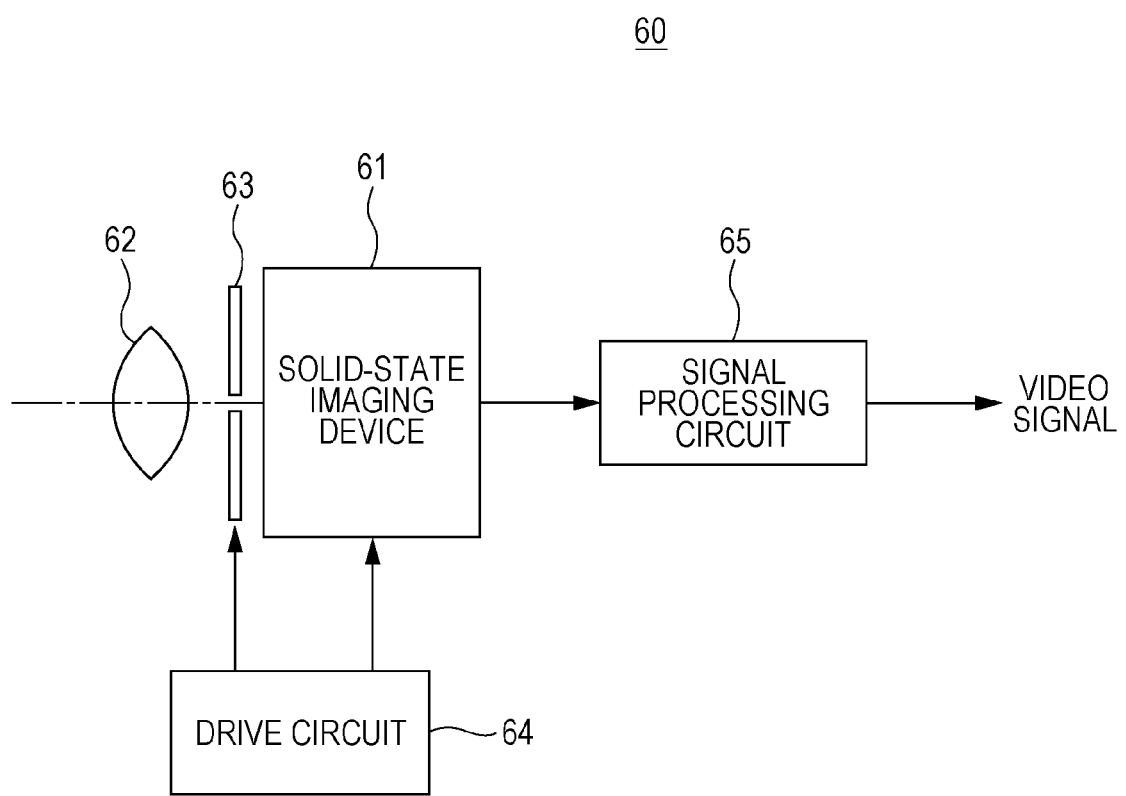
FIG. 12 shows the configuration of an electronic device.

The solid-state imaging device discussed above may be applied to electronic devices such as camera systems such as digital cameras and video cameras, cellular phones having an imaging function, and other devices having an imaging function, for example. FIG. 12 shows a schematic configuration in which the solid-state imaging device is applied to a camera capable of capturing a still image or a movie as an example of the electronic devices.

A camera 60 according to the embodiment includes a solid-state imaging device 61, an optical system 62 that guides incident light to a photosensor section of the solid-state imaging device 61, a shutter device 63 provided between the solid-state imaging device 61 and the optical system 62, and a drive circuit 64 that drives the solid-state imaging device 61. The camera 60 further includes a signal processing circuit 65 that processes an output signal of the solid-state imaging device 61.

The semiconductor device according to the second embodiment discussed above may be used as the solid-state imaging device 61. The optical system (optical lens) 62 forms an image on an imaging surface (not shown) of the solid-state imaging device 61 in accordance with image light (incident light) from a subject. This allows a signal charge to be accumulated in the solid-state imaging device 61 over a certain period. The optical system 62 may be formed from an optical lens group including a plurality of optical lenses. The shutter device 63 controls a period of irradiation of the solid-state imaging device 61 with incident light and a period for which the incident light is blocked.

The drive circuit 64 supplies a drive signal to the solid-state imaging device 61 and the shutter device 63. Through the supplied drive signal, the drive circuit 64 controls an operation of the solid-state imaging device 61 to output a signal to the signal processing circuit 65 and a shutter operation of the shutter device 63. That is, in the embodiment, the solid-state imaging device 61 transfers a signal to the signal processing circuit 65 in accordance with the drive signal (timing signal) supplied from the drive circuit 64.

The signal processing circuit 65 performs various signal processing on the signal transferred from the solid-state imaging device 61. The signal (video signal) on which the various signal processing has been performed is stored in a storage medium (not shown) such as a memory, or output to a monitor (not shown).

The present disclosure may be configured as follows.

(1) A semiconductor device including: a semiconductor element; a connection electrode formed on the semiconductor element; and alignment marks formed on the semiconductor element, in which at least one of the alignment marks is made of a magnetic material.

(2) The semiconductor device according to (1), further including: an underfill resin formed to cover the connection electrode.

(3) The semiconductor device according to (1) or (2), in which the magnetic material contains at least one selected from Fe, Co, and Ni.

(4) The semiconductor device according to any one of (1) to (3), in which the alignment mark made of the magnetic material is formed at two or more locations on the semiconductor device.

(5) The semiconductor device according to any one of (1) to (4), in which a height of the alignment marks from a surface of the semiconductor element is equal to or less than a height of the connection electrode and equal to or more than a height of a surface on which the connection electrode is formed.

(6) A semiconductor device including: a semiconductor substrate; a wiring layer formed on the semiconductor substrate; a connection electrode formed on a surface of the wiring layer; and alignment marks formed in the same layer as the connection electrode, in which at least one of the alignment marks is made of a magnetic material.

(7) A manufacturing method for a semiconductor device, including: preparing a substrate on which a semiconductor element is formed; forming alignment marks on the substrate; and forming a connection electrode on the substrate, in which at least one of the alignment marks formed on the semiconductor element is made of a magnetic material.

(8) The manufacturing method for a semiconductor device according to (7), further including: heating the magnetic material to a Curie temperature or higher to demagnetize the alignment marks.

The present disclosure contains subject matter related to that disclosed in Japanese Priority Patent Application JP 2011-129192 filed in the Japan Patent Office on Jun. 9, 2011, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device comprising:
a first semiconductor element;
a first connection electrode formed on the first semiconductor element;
a first alignment mark formed on the first semiconductor element, wherein the first alignment mark includes magnetic material;
a second semiconductor element;
a second connection electrode formed on the second semiconductor element, wherein the second connection electrode contacts the first connection electrode;
a second alignment mark formed on the second semiconductor element, wherein the second alignment mark includes magnetic material; and
a first underfill resin layer and a second underfill resin layer disposed between a first surface of the first alignment mark and a first surface of the second alignment mark in a direction perpendicular to a first surface of the first semiconductor element on which the first alignment mark is formed,
wherein,
the first surface of the first alignment mark is parallel to the first surface of the second alignment mark,
the first underfill resin layer contacts the first surface of the first alignment mark and the second underfill resin layer,
the second underfill resin layer contacts the first surface of the second alignment mark and the first underfill resin layer,
a height of the first alignment mark from the first surface of the first semiconductor element is less than a height of the first connection electrode from the first surface of the first semiconductor element,
the height of the first alignment mark from the first surface of the first semiconductor element is greater than the first surface on which the first connection electrode is formed,
a height of the second alignment mark from a first surface of the second semiconductor element is equal to or less than a height of the second connection electrode from the first surface of the second semiconductor element, and
the height of the second alignment mark from the first surface of the second semiconductor element is greater than the first surface of the second semiconductor element on which the second connection electrode is formed.

2. The semiconductor device according to claim 1, wherein a magnetic polarity of the first alignment mark is opposite to a magnetic polarity of the second alignment mark.

3. The semiconductor device according to claim 1, wherein the magnetic material contains at least one selected from Fe, Co, and Ni.

4. The semiconductor device according to claim 1, wherein a plurality of alignment marks that include the magnetic material are formed at two or more locations on the first semiconductor element.

5. The semiconductor device according to claim 1, wherein the underfill resin layer covers a side surface of the first and second alignment marks.

6. The semiconductor device according to claim 1, wherein a gap exists between the first surface of the first alignment mark and the first surface of the second alignment mark in the direction perpendicular to the first surface of the first semiconductor element on which the first alignment mark is formed in a first configuration, and the first surface of the first alignment mark contacts the first surface of the second alignment mark in the direction perpendicular to the first surface of the first semiconductor element on which the first alignment mark is formed in a second configuration.

7. The semiconductor device according to claim 1, further including a barrier layer between the first connection electrode and the first semiconductor element.

8. An electronic apparatus, comprising:
an optical system;
a solid-state imaging device, wherein the solid-state imaging device is configured to receive light from the optical system, the solid-state imaging device including:
a first semiconductor element;
a first connection electrode formed on the first semiconductor element;
a first alignment mark formed on the first semiconductor element, wherein the first alignment mark includes magnetic material;
a second semiconductor element;
a second connection electrode formed on the second semiconductor element, wherein the second connection electrode contacts the first connection electrode;
a second alignment mark formed on the second semiconductor element, wherein the second alignment mark includes magnetic material; and
a first underfill resin layer and a second underfill resin layer disposed between a first surface of the first alignment mark and a first surface of the second alignment mark in a direction perpendicular to a first surface of the first semiconductor element on which the first alignment mark is formed,
wherein,
the first surface of the first alignment mark is parallel to the first surface of the second alignment mark,
the first underfill resin layer contacts the first surface of the first alignment mark and the second underfill resin layer,
the second underfill resin layer contacts the first surface of the second alignment mark and the first underfill resin layer,
a height of the first alignment mark from the first surface of the first semiconductor element is less than a height of the first connection electrode from the first surface of the first semiconductor element,
the height of the first alignment mark from the first surface of the first semiconductor element is greater than the first surface on which the first connection electrode is formed,
a height of the second alignment mark from a first surface of the second semiconductor element is equal to or less than a height of the second connection electrode from the first surface of the second semiconductor element, and the height of the second alignment mark from the first surface of the second semiconductor element is greater than the first surface of the second semiconductor element on which the second connection electrode is formed;

a drive circuit configured to drive the solid-state imaging device; and a signal processing circuit configured to process an output of the solid-state imaging device.

9. The electronic apparatus according to claim 8, wherein a magnetic polarity of the first alignment mark is opposite to a magnetic polarity of the second alignment mark.

10. The electronic apparatus according to claim 8, wherein the magnetic material contains at least one selected from Fe, Co, and Ni.

11. The electronic apparatus according to claim 8, wherein a plurality of alignment marks that include the magnetic material are formed at two or more locations on the first semiconductor element.

12. The electronic apparatus according to claim 8, wherein the underfill resin layer covers a side surface of the first and second alignment marks.

13. The electronic apparatus according to claim 8, wherein a gap exists between the first surface of the first alignment mark and the first surface of the second alignment mark in the direction perpendicular to the first surface of the first semiconductor element on which the first alignment mark is formed in a first configuration, and the first surface of the first alignment mark contacts the first surface of the second alignment mark in the direction perpendicular to the first surface of the first semiconductor element on which the first alignment mark is formed in a second configuration.

14. The electronic apparatus according to claim 8, further including a barrier layer between the first connection electrode and the first semiconductor element.

* * * * *